United States Patent [19]
Ide

[11] Patent Number: 5,247,485
[45] Date of Patent: Sep. 21, 1993

[54] MEMORY DEVICE
[75] Inventor: Kazuhiko Ide, Kawasaki, Japan
[73] Assignee: Kabushiki Kaisha Toshiba, Kawasaki, Japan
[21] Appl. No.: 842,417
[22] Filed: Mar. 26, 1992

Related U.S. Application Data

[63] Continuation of PCT/JP91/01347, Oct. 4, 1991

[30] Foreign Application Priority Data

Oct. 4, 1990 [JP] Japan ................... 2-265000

[51] Int. Cl.$^5$ ............... G11C 8/00; G11C 7/00
[52] U.S. Cl. .............. 365/230.01; 365/230.05; 365/230.08; 365/189.04; 365/189.05; 365/233
[58] Field of Search ............. 365/230.01, 230.05, 365/230.07, 230.08, 189.04, 189.05, 189.07, 233; 307/480, 464, 269; 371/36; 328/63

[56] References Cited

U.S. PATENT DOCUMENTS

| 4,682,048 | 7/1987 | Ishimoto | 365/233 |
| 4,688,094 | 8/1987 | Tanabe et al. | 307/269 |
| 4,734,880 | 3/1988 | Collins | 365/233 |
| 4,829,475 | 5/1989 | Ward et al. | 365/230.08 |
| 4,891,788 | 1/1990 | Kreifels | 365/230.08 |

FOREIGN PATENT DOCUMENTS

| 61-196497 | 8/1986 | Japan | 365/230.01 |
| 62-55722 | 3/1987 | Japan . | |
| 62-146036 | 6/1987 | Japan . | |
| 1-32135 | 10/1989 | Japan . | |
| 1-317298 | 12/1989 | Japan | 365/230.01 |
| 2-137183 | 5/1990 | Japan | 365/230.01 |
| 2-217919 | 8/1990 | Japan . | |
| 3-141092 | 6/1991 | Japan | 365/230.01 |
| 2138230A | 10/1984 | United Kingdom | 365/230.01 |

Primary Examiner—Eugene R. LaRoche
Assistant Examiner—Andrew Tran
Attorney, Agent, or Firm—Cushman, Darby & Cushman

[57] ABSTRACT

In a memory device according to the present invention, an address for writing input data into a memory (306) is designated by a first address counter (303) which operates in response to a first clock, an address for reading written data from the memory (306) is designated by a second address counter which operates in response to a second clock, and a phase difference between the outputs of the individual address counter means (303, 313) is detected by a phase comparing section (307). A timing generating section (114–116) delays a signal acquired from the first or second clock to generate three or more timings, a time difference between any two of the timings being a any non-integer multiple of the first or second clock cycle. Further, a phase comparison discriminating section (120–122, 126) latches the output of the phase comparing section (307) at three or more timings, and outputs a signal for controlling a second address counter section (313) by majority decision on the latching result.

1 Claim, 4 Drawing Sheets

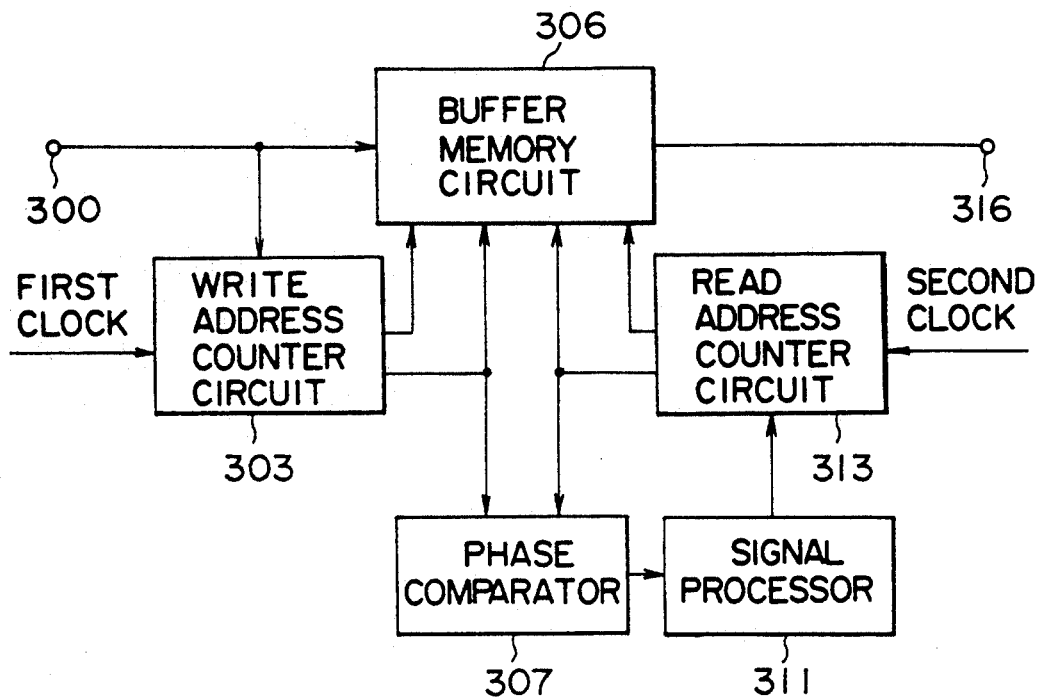
F I G. 1
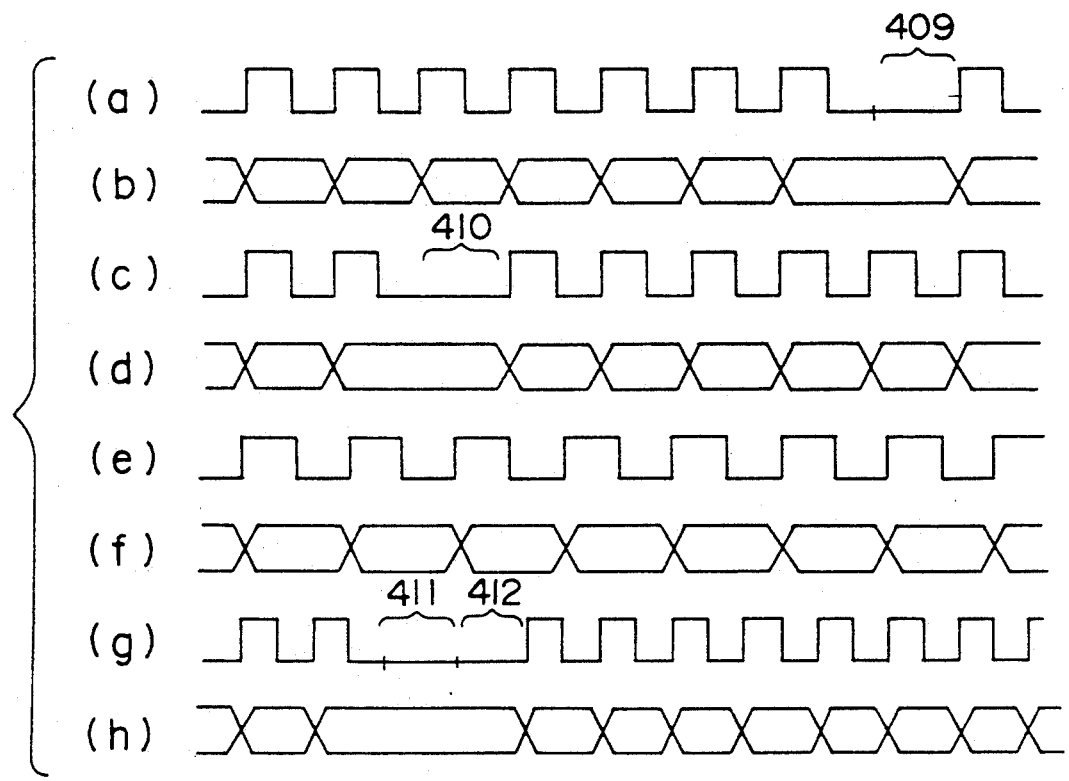
F I G. 2

MEMORY DEVICE

Continuation of PCT/JP91/01347, Oct. 4, 1991

TECHNICAL FIELD

The present invention relates to a buffer memory for exchanging data between two digital signal processing systems.

BACKGROUND ART

It is well known that in transferring a digital signal a buffer memory is used to exchange data between two digital signal processing systems in order to absorb fluctuation of a clock caused by the difference in clock speed between a self-station and the other station, a change in temperature on a transmission line, etc.

FIG. 1 illustrates the structure of a conventional memory device which performs the above-described process.

In FIG. 1, a data signal, input to an input terminal 300, is sent to a buffer memory circuit 306, while a first clock is sent to a write address counter circuit 303.

The write address counter circuit 303 counts the first clock, and outputs a write clock and a write address signal to write the input data signal.

The write clock and write address signal are supplied respectively to the write clock input terminal and write address signal input terminal of the buffer memory circuit 306. Based on these signals, the input data signal is stored at a designated address in the buffer memory circuit 306.

A second clock is sent to a read address counter circuit 313. The read address counter circuit 313 counts the second clock, and outputs a read clock and a read address signal.

The read clock and read address signal are respectively sent to the read clock input terminal and read address signal input terminal of the buffer memory circuit 306.

Based on these signals, the input data signal being stored at the designated address in the buffer memory circuit 306 is read out and sent to an output terminal 316.

The write address signal and the read address signal are supplied to a phase comparator 307, which provides a phase comparison signal corresponding to a phase difference between those address signals. The phase comparison signal, which shows the difference between the data writing speed and the data reading speed of the buffer memory 306, is acquired from a differential signal between the write address signal and the read address signal. The phase comparison signal is sent to a signal processor 311.

Based on the phase comparison signal, the signal processor 311 outputs a signal for slowing a read clock cycle when the second clock cycle is faster than the first clock cycle. When the second clock cycle is slower, the signal processor 311 outputs a signal for quickening the read clock cycle. The output signal of the signal processor 311 is sent as a read address counter control signal to the control terminal of the read address counter circuit.

The operation of the circuit shown in FIG. 1 will now be explained referring to FIG. 2.

In FIG. 2, (a) shows a write clock, (b) a write address signal, (c), (e) and (g) read clocks, and (d), (f) and (h) read address signals.

When the cycles of the first and second clocks are equal to each other, the number of pieces of input data in one frame has only to be equal to that of output data in one frame. Thus, stuffing bits 410 corresponding to stuffing bits 409 (previously inserted) in the write clock has only to be inserted (see FIG. 2 (c) and (d)).

If the second clock cycle is slower than the first clock cycle, the number of pieces of data to be written into the buffer memory circuit 306 is larger than that of data to be read out from the buffer memory circuit 306. Accordingly, the buffer memory circuit 306 overflows. It is therefore necessary to read out extra data at the position of the stuffing bits 410 in the read clock (c) once in some frames (see FIG. 2 (e) and (f)).

If the second clock cycle is faster than the first clock cycle, the number of pieces of data to be written into the buffer memory circuit 306 is less than that of data to be read out from the buffer memory circuit 306, thus causing the buffer memory circuit 306 to become a memory-slipping state. It is therefore necessary to add stuffing bits 412 at the position of the stuffing bits 410 in the read clock (c) once in some frames so as to perform empty data reading (see FIG. 2 (g) and (h)).

Through above-described operation, it is possible to cope with the case where the first and second clocks have different cycles.

If the first and second clocks are asynchronous signals, or if both clocks, though synchronous signals, have a relative phase fluctuation, the phases of signals output from the write address counter circuit 303 and the read address counter circuit 313 are also shifted. A spike therefore occurs in the phase comparison signal acquired through phase comparison on those output signals.

When the phase comparison signal is sent directly to the read address counter circuit 313, the spike of the phase comparison signal ma match with the edge of the second clock. In this case, the read address counter circuit 313 will not be properly controlled to have a synchronism, causing a memory slip by which the read address passes the write address.

The prior art is therefore provided with the signal processor 311 to process the phase comparison signal. In other words, after smoothing the spike of the phase comparison signal by means of a capacitor or the like to eliminate the spike, the signal processor 311 in FIG. 1 detects a phase-shifted direction or the like and sends it as a read address counter control signal to the read address counter circuit 313.

As described above, the conventional memory device uses an analog processor as a signal processor. The conventional memory device therefore needs adjusting steps for determining whether or not the write address and the read address have the proper phase difference, has a difficulty in achieving circuit integration with a digital circuit, and is not stable to an aged deterioration.

It is therefore an object of the present invention to provide a stable memory device which is designed entirely into a digital circuit and has no aged deterioration.

DISCLOSURE OF THE INVENTION

A memory device according to the present invention comprises first address counter means operative in response to a first clock to designate an address for writing input data into a memory; second address counter means operative in response to a second clock to designate an address for reading out written data from the memory; phase comparing means for detecting a phase difference between outputs of the first and second address counter means; a timing generating means for delaying a signal acquired from the first clock or the second clock to generate three or more timings, a time difference between any two of the timings being a non-integer multiple of a cycle of the first or second clock; and phase comparison discriminating means for latching an output of the phase comparing means at the three or more timings, and outputting a signal for controlling the second address counter means by majority decision on a result of the latching.

According to the present invention, because of the above-described means, the entire memory device can be designed in a digital form, allowing the whole device to be made into an integrated circuit. This eliminates the need for adjusting steps, thus providing a stable memory device having no aged deterioration.

BRIEF DESCRIPTION OF THE DRAWINGS

FIG. 1 is a diagram illustrating a conventional memory device;

FIG. 2 is a diagram for explaining operational timings of a circuit shown in FIG. 1;

BEST MODE OF CARRYING OUT THE INVENTION

A preferred embodiment of the present invention will now be described referring to the accompanying drawings.

Figure 3A:
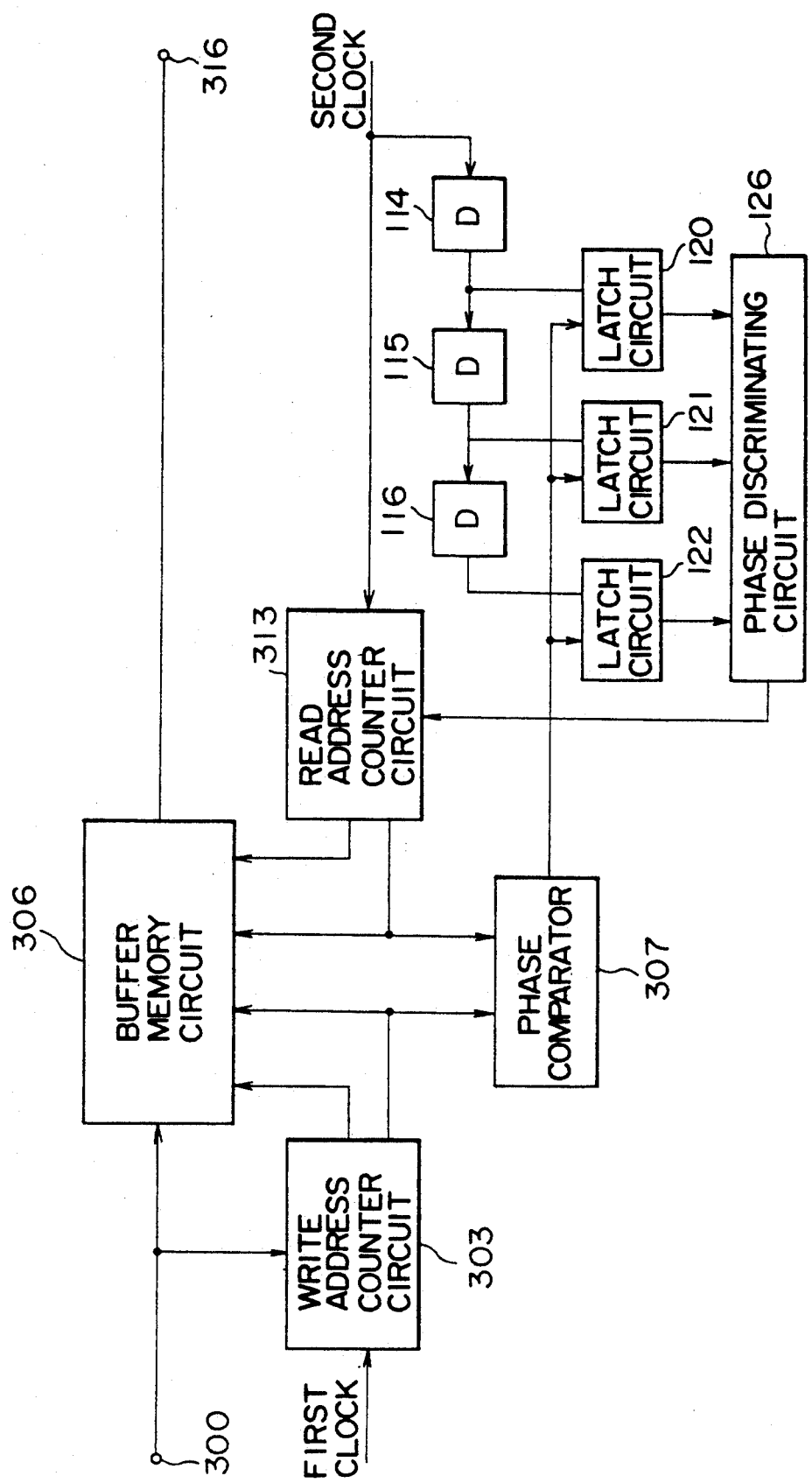
FIGS. 3 (a) and (b) are diagrams showing a memory device according to the present invention.
Figure 3B:
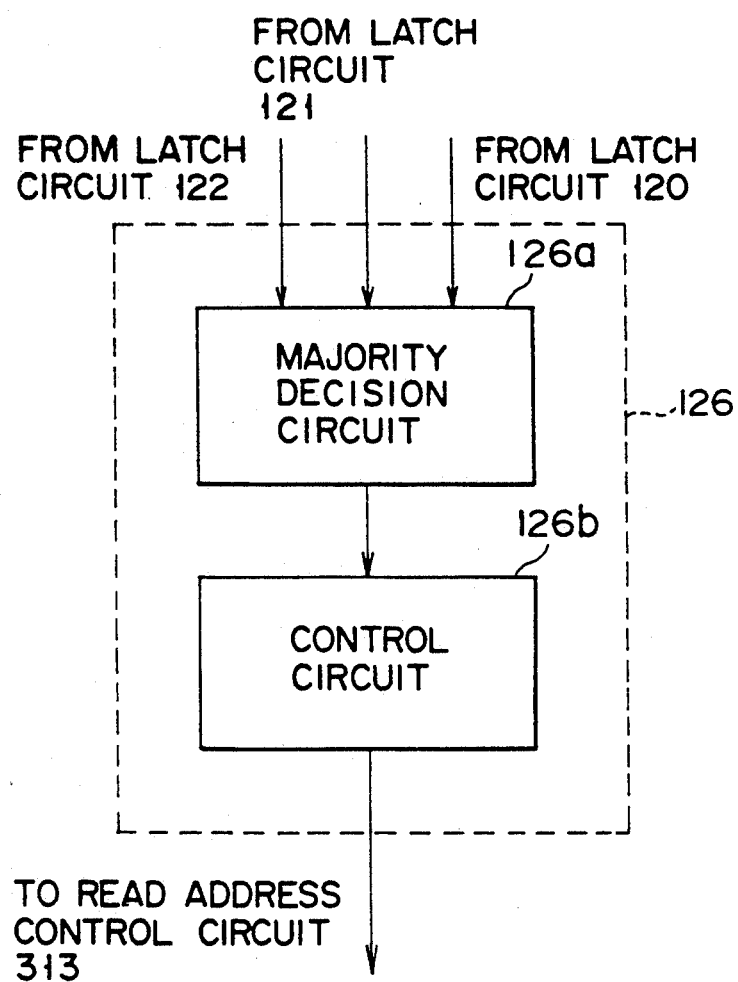

FIG. 3 illustrates one embodiment according to the present invention.

Since the present invention is concerned with the signal processor 311 shown in FIG. 1, the same reference numerals are used to denote corresponding sections.

A phase comparison signal from a phase comparator 307 already described referred to FIG. 1 is sent to latch circuits 120 to 122. A second clock to be sent to a read address counter 313 is sent to the clock terminals of the latch circuits 120 to 122 via delay units 114 to 115, respectively.

More specifically, a clock sent via the delay unit 114 is input to the latch circuit 120, a clock passing through the delay units 114 and 115 in series is input to the latch circuit 121, and a clock passing through the delay units 114 to 116 in series is input to the latch circuit 122. Delay times D of the delay units 114 to 116 are equal to one another, one sixth of a cycle of the second clock, for example.

After the phase comparison signal is set at different timings by the latch circuits 120 to 122, the signals are supplied to a phase discriminating circuit 126. The phase discriminating circuit 126 detects a phase shift by majority decision based on the three phase comparison signals, and outputs it as an address control signal to the control terminal of a read address counter.

The operation of the circuit shown in FIG. 3 will further be explained below referring to FIG. 4.

Figure 4:
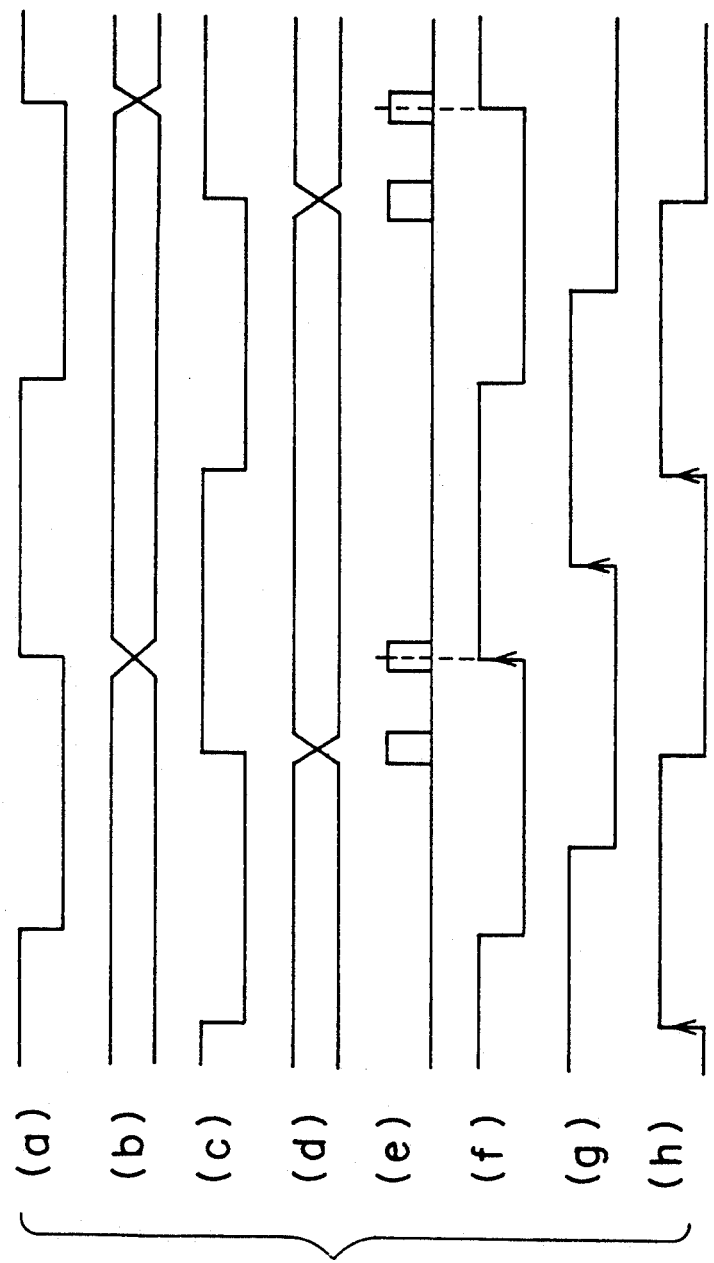
FIG. 4 is a diagram for explaining operational timings of a circuit shown in FIG. 3.

In FIG. 4, (a) shows a first clock, (b) a write address signal, (c) a second clock, (d) a read address signal, (e) a phase comparison signal, (f) the output of the latch circuit 120, (g) the output of the latch circuit 121, and (h) the output of the latch circuit 122.

The phase comparison signal acquired in the phase comparator 307 has a spike at the transitional point of the clock (see FIG. 4 (e)). This is because a slight shift occurs in the outputs of the address counters 303 and 313 for every bit.

Suppose that the phase comparison signal is set by the latch circuits 120 to 122 at timings as indicated in FIG. 4 (f) to (h). The phase comparison signal latched at the timing in (f) overlaps a spike, providing an incorrect result. The phase comparison signals latched at the timings in (g) and (h) are effective. Based on the two properly-acquired phase comparison signals out of three, the phase comparison discriminating circuit 126 outputs an address control signal.

The read address counter 313 adjusts the read address clock in accordance with the address control signal, and controls a speed for reading out data from the buffer memory 306.

Through the above-described operation, the memory device with the above structure can properly control the read address counter even if the writing side operates asynchronously with the reading side.

In this embodiment, clocks acquired by delaying the second clock are used as clocks to be input to the latch circuits 120 to 122, but they are not restrictive. The same effect can be obtained using a signal yielded based on the second clock, such as a timing signal provided by decoding the result of the operation of the counter which operates in response to the second clock.

The same effect can be attained regardless of whether data to be sent to the input terminal 300 is parallel data or serial data.

Industrial Applicability

As described above, the present invention can design the whole memory device into a digital circuit, thereby eliminating the need for adjusting steps, and can realize a stable memory device without an aged deterioration.

I claim:

1. A memory device comprising:

first address counter means operative in response to a first clock to designate an address for writing input data into a memory;

second address counter means operative in response to a second clock to designate an address for reading out written data from said memory;

phase comparing means for detecting a phase difference between outputs of said first and second address counter means;

a timing generating means for delaying a signal acquired from said first clock or said second clock to generate three or more timings, a time difference between any two of said timings being a non-integer multiple of a cycle of said first or second clock; and phase comparison discriminating means for latching an output of said phase comparing means at said three or more timings, and outputting a signal for controlling said second address counter means by majority decision on a result of said latching.

* * * * *